(12) United States Patent
Jefferson et al.

(10) Patent No.: US 8,254,079 B2
(45) Date of Patent: Aug. 28, 2012

(54) EPR PAIR GENERATION

(75) Inventors: John Henry Jefferson, Worcestershire (GB); Michael Fearn, Worcestershire (GB); George Giavaras, Leicester (GB)

(73) Assignee: Qinetiq Limited (GB)

( * ) Notice: Subject to any disclaimer, the term of this patent is extended or adjusted under 35 U.S.C. 154(b) by 647 days.

(21) Appl. No.: 12/524,911

(22) PCT Filed: Feb. 1, 2008

(86) PCT No.: PCT/GB2008/000321
§ 371 (c)(1),
(2), (4) Date: Jul. 29, 2009

(87) PCT Pub. No.: WO2008/093087
PCT Pub. Date: Aug. 7, 2008

(65) Prior Publication Data
US 2010/0085678 A1 Apr. 8, 2010

(30) Foreign Application Priority Data
Feb. 2, 2007 (GB) .................................. 0702026.6

(51) Int. Cl.
*G03G 15/056* (2006.01)
(52) U.S. Cl. ....................................................... 361/225
(58) Field of Classification Search .................. 361/225
See application file for complete search history.

(56) References Cited

U.S. PATENT DOCUMENTS

2007/0014214 A1* 1/2007 Nozawa ..................... 369/47.1
2010/0085678 A1* 4/2010 Jefferson et al. ............. 361/225

FOREIGN PATENT DOCUMENTS
GB 2 345 368 3/2001
(Continued)

OTHER PUBLICATIONS
Couto, Jr. et al., "Photon anti-bunching in acoustically pumped quantum dots"—Abstract. Nature Photonics 3, 645-648 (2009); Published online: Oct. 25, 2009 | doi: 10.1038/nphoton.2009.191.*

(Continued)

*Primary Examiner* — Ronald W Leja
(74) *Attorney, Agent, or Firm* — McDonnell Boehnen Hulbert & Berghoff LLP

(57) ABSTRACT

The present invention relates to the formation of electron spin EPR pairs and manipulation of such entangled electrons. The invention comprises a static quantum dot located part way along a quantum wire with means for adjusting the confining potential of the quantum dot. The quantum wire may for instance be formed by gate electrode (4, 6) with the quantum dot formed by a further gate electrode (8). The invention also comprises means for generating a electrostatic wave propagating along the wire, such as a surface acoustic wave transducer (10). In use a pair of electrons may be loaded into the static quantum dot and allowed to relax to a singlet ground state, in which the electrons are spin entangled. The propagating electrostatic wave acts as a series of quantum dots moving along the quantum wire. The confining potential of the static quantum dot is adjusted in time with arrival of a moving quantum dot so that one of the spin entangled electrons will tunnel to the moving quantum dot with preserved entanglement. The same process can be used to separately eject the remaining electron. The process can also be applied in reverse transport electrons from a moving quantum dot into a static dot.

20 Claims, 3 Drawing Sheets

FOREIGN PATENT DOCUMENTS

GB  2 417 330  2/2006

OTHER PUBLICATIONS

Barnes, et al. "Quantum Computation Using Electrons Trapped by Surface Acoustic Waves", Physical Review B, vol. 62, No. 12, Sep. 15, 2000, pp. 8410-8419.

Talyanskii, et al., "Quantized Current in One-Dimensional Channel Induced by Surface Acoustic Waves", Physica B Elsevier Netherlands, vol. 249-251, Jun. 1998, pp. 140-146.

Giavaras, et al., "Singlet-Triplet Filtering and Entanglement in a Quantum Dot Structure", Physical Review B, vol. 75, No. 8, Feb. 1, 2007, pp. 085302-1-6.

Giavaras, et al., "Generation of Einstein-Podolsky-Rosen Pairs and Interconversion of Static and Flying Electron Spin Qubits", Physical Review B, vol. 76, No. 24, Dec. 15, 2007, pp. 245328-1-6.

Giavaras, et al., "Quantum Entanglement Generation with Surface Acoustic Waves", Physical Review B, vol. 74, No. 19, Nov. 15, 2006, pp. 195341-1-15.

Chouikka, et al., "Measure of Entanglement States of Two Interacting Electrons in Vertically Coupled Quantum Dots Induced by a Time-Dependent Electric Field", Journal of Superconductivity, vol. 16, No. 2, Apr. 2, 2003, pp. 313-317.

Loss, et al., "Probing Entanglement and Nonlocality of Electrons in a Double-Dot Via Transport and Noise", Physical Review Letters, vol. 84, No. 5, Jan. 31, 2000, pp. 1035-1038.

Recher, et al., "Creation of Nonlocal Spin-Entangled Electrons Via Andreev Tunneling, Coulomb Blockade, and Resonant Transport", Journal of Superconductivity, vol. 15, No. 1, Feb. 2002, pp. 49-65.

Saraga, et al., "Coulomb Scattering in a 2D Interacting Electron Gas and Production of EPR Pairs", Physical Review Letters, vol. 92, No. 24, Jun. 18, 2004, pp. 246803-1-4.

Zhang, et al., "Generation of Spatially Separated Spin Entanglement in a Triple-Quantum-Dot System", Physical Review A, 69, 2004, pp. 42307-1-6.

Recher, et al., "Andreev Tunneling, Coulomb Blockage, and Resonant Transport of Nonlocal Spin-Entangled Electrons", Physical Review B, vol. 63, 2001, pp. 165314-1-11.

Hu, et al., "Double Quantum Dot Turnstile as an Electron Spin Entangler", Physical Review B, 69, 2004, pp. 115312-1-10.

Gumbs, et al., "Quantum Entanglement for Acoustic Spintronics", Physical Review A, 70, 2004, pp. 50302-1-4.

Ebbecke, et al., "Acoustoelectric Current Transport Through a Double Quantum Dot", Physical Review B, 72, 2005, pp. 121311-1-4.

Shilton, et al., "High-Frequency Single-Electron Transport in a Quasi-One-Dimensional GaAs Channel Induced by Surface Acoustic Waves", J. Phys.: Condens, Matter 8, 1996, pp. L531-L539.

\* cited by examiner a)

b)

c)

d)

EPR PAIR GENERATION

BACKGROUND OF THE INVENTION (1) Field of the Invention

This invention relates to the formation of electron spin EPR pairs, i.e. fully spin entangled electrons, and manipulation thereof. The invention also relates to the formation and interconversion of flying and static electron spin qubits.

(2) Description of the Art

Quantum information systems process or transmit information using quantum bits, referred to as qubits. Often it is desired that the qubits are formed as entangled EPR (Einstein-Podolsky-Rosen) pairs. As the skilled person will be fully aware EPR particle pairs are particles such as electrons or photons having fully entangled quantum properties that may be spatially separated. A qubit entangler is therefore of fundamental importance in quantum information systems. Having formed an entangled qubit pair it is also necessary to be able to manipulate the qubits. The ability to interconvert static and flying qubits is a basic requirement for a functional system. In the art the term "static" is used to refer to a qubit held in place and the term "flying" is used to refer to a qubit which is moving. Interconversion is the process of turning a static qubit into a flying qubit or vice versa.

In the solid state both the creation of an entangler for massive particles and the interconversion of qubits are hard tasks since the process of generation and detection must take place in a controlled way and in a much shorter time than typical decoherence times.

Any two-state quantum system has the potential to act as a qubit. One promising candidate is the spin of a single electron, which has two basic states, spin-up and spin-down. Electron spins have a number of possible advantages for use as qubits such as relatively long decoherence times, manipulation by magnetic fields, realisation in solid state devices, ability to be transported from one location to another and potential for controlled interaction with other spins to exchange quantum information.

Various entangler schemes have been proposed for generating electron spin EPR pairs. A number of approaches have used one or more quantum dots in which electron spins are delocalised by lowering barriers, allowing them to escape or be channeled in certain directions. For instance Saraga et al. "Coulomb Scattering in a 2D Interacting Electron Gas and Production of EPR Pairs" Phys. Rev. Lett. 92, 246803 teaches coulomb scattering to produce singlet states with frequency selection of the interacted electrons. Zhang et al. "Generation of Spatially Separated Spin Entanglement in a Triple Quantum Dot System", Phys. Rev. A, 69, 042307 discusses use of a triple quantum dot structure and adiabatic manipulation of gate voltages. Recher et al. "Andreev tunneling, Coulomb blockade, and resonant transport of nonlocal spin-entangled electrons", Phys. Rev. B., 63, 165314 propose a spin entangler based on an s-wave superconductor coupled to two quantum dots. Hu et al. "Double quantum dot turnstile as an electron spin entangler", Phys. Rev. B, 69, 115312 study use of a double dot turnstile as a reliable entangler. All of these approaches have yet to be verified experimentally and have issues associated with control of the qubits and decoherence.

Another suggested approach is to utilise the interaction between electrons carried by surface acoustic waves (SAWs). The spin of a single electron in a minimum of the electrostatic wave produced by a SAW in a semiconductor quantum wire will interact with the spin of a single electron in a neighbouring quantum wire if they are sufficiently close and it has been suggested this interaction will produce entanglement between the two electrons. See, for example, Gumbs et al., "Quantum entanglement for acoustic spintronics", Phys. Rev. A. 70, 050302 or Ebbecke et al. "Acoustoelectric current transport through a double quantum dot", Phys. Rev. B, 72, 121311. The main disadvantage of using such a scheme, and related schemes using propagating and bound spins, is that it is very difficult to control the degree of entanglement and, in particular, full entanglement is extremely difficult to achieve in a controlled way due to the exponential change in exchange coupling with distance.

SUMMARY OF THE INVENTION

The present invention therefore aims to provide an apparatus and method for forming fully entangled electron spin EPR pairs and means for the interconversion of static and flying qubits.

Thus according to the present invention there is provided an apparatus comprising, in use, a static quantum dot located part way along a quantum wire, means for generating an electrostatic wave propagating along the quantum wire and means for adjusting the electrostatic potential of the quantum dot in synchronisation with the propagating electrostatic wave.

In use two electrons are trapped in the static quantum dot and the two electrons are allowed to relax into a singlet ground state, i.e. a fully entangled state in which one electron will be spin-up and the other will be spin down. The static quantum dot therefore allows the electrons to form an EPR pair of qubits. To eject one of the electrons a propagating electrostatic wave is applied along the quantum wire. As has been demonstrated previously the minima of the electrostatic wave act as moving quantum dots and are capable of transporting electrons along a quantum wire. As the electrostatic wave is applied along the quantum wire a synchronous variation of the confining potential of the static quantum dot is applied so as to tune the confining potential to allow one electron to tunnel out of the static quantum dot and into a minimum of the electrostatic wave, i.e. into a moving quantum dot. The transfer of one electron from the static quantum dot to the moving quantum dot can occur without any spin excitations of the system and hence the entanglement of the spins is preserved. The apparatus of the present invention therefore provides a means of creating a static and flying EPR electron spin pair.

Having ejected the first electron the second electron can also be ejected in the same way. Again an electrostatic wave is generated along the quantum wire and a varying potential is synchronously applied to vary the static quantum dot confining potential. The variation of the static quantum dot potential takes account of the fact that there is now only one electron in the static quantum dot and again is arranged in time to ensure that the remaining electron tunnels into a moving quantum dot of the electrostatic wave.

Thus both of the entangled electrons can be transferred to a moving quantum dot for transport to some desired location.

The same process can also be used to trap an electron held in a moving quantum dot in a static quantum dot. The electron is transported along the quantum wire in a moving quantum dot of an electrostatic wave. As the electron reaches the location of the static quantum dot the potential of the static quantum dot is varied so as to cause the electron to tunnel from the moving quantum dot to the static quantum dot. The electrostatic wave then continues down the quantum wire with empty moving quantum dots and the electron remains trapped in the static quantum dot. In this way a flying qubit can be converted to a static qubit in another quantum dot. This process also provides a mechanism for loading two non entangled electrons in the static quantum dot so as to subsequently form an EPR pair. After a first electron has been loaded into the static quantum dot a second electron is carried along the quantum wire in a moving quantum dot of an electrostatic wave. As this second electron reaches the static quantum dot containing the first electron a variation of the confining potential is applied to the quantum dot so that the second electron tunnels into the static quantum dot and remains trapped therein whilst the electrostatic wave passes. The variation to the potential of the quantum dot must, of course, take account of the fact that the static quantum dot holds the first electron. Alternatively two electrons could be located in the moving quantum dot and one or both of these electrons trapped in the static quantum dot.

As will be understood by one skilled in the art the number of electrons carried in the moving quantum dots can be accurately controlled by passing the electrostatic wave through split gates, the bias of which is accurately controlled to control the number of electrons in the moving quantum dots. The negative bias of the gate can be controlled so that a quantum dot which passes through the split gate contains exactly one electron. The negative bias can also be increased to ensure no electrons pass the split gate and the moving quantum dots are therefore empty of electrons when they pass the split gate or the bias can be reduced to a level where each quantum dot passing the split gate contains precisely two electrons.

It will also be clear to the skilled person that other methods exist for loading the static quantum dot. For instance a turnstile arrangement could be used in which the barrier potential of a quantum turnstile is controllably lowered to let an electron tunnel through the barrier. Such an arrangement could be used to allow a first electron and then a second electron through the turnstile and to propagate to the static quantum dot. The method of loading the static quantum dot using a moving quantum dot as described above is advantageous however in that it is a very robust and also rapid method. Electrons in the moving quantum dots propagate at the speed of the electrostatic wave whereas, in the turnstile method, the speed is dependent on the timescale for electron tunneling.

The present invention therefore provides a practical, controllable way of loading two electrons into a static quantum dot to generate a fully entangled EPR electron spin pair and subsequently spatially separating the pair whilst preserving entanglement. The invention also provides a controllable way of converting a static qubit to a flying qubit and vice versa.

As will be described more fully later the present invention controls, or tunes, the potential of the static quantum dot in time with the varying potential of the electrostatic wave to achieve a desired electron occupation with very high probability. It has been shown by the present inventors a pair of electrons in a singlet state held in a fixed potential static quantum dot can remain well localised within the static quantum dot without tunneling during application of an electrostatic wave. The state evolves via non-adiabatic Landua-Zener transitions which enable the state to retain its initial character without spin excitations. It has also been shown that changing the confining potential of the static quantum well can change the probability of Landau-Zener transitions. The means that adjusting the potential of the quantum dot therefore tunes the potential of the static quantum dot in time with the varying electrostatic wave to achieve a total time varying potential which leads to the desired occupation probabilities. For instance to eject one of two electrons held in the static quantum dot the total potential is controlled so as to lead to a period of time where Landua-Zener transitions occur with minimal probability due to a weakened tunneling barrier between the moving and static quantum dots with the result that an electron tunnels between the moving and static quantum dots. Following this time the potential is tuned to allow Landau-Zener transitions with high probability so as to ensure that the other electron remains bound in the static quantum dot with high probability and without spin excitation.

Conveniently the means for adjusting the potential of the quantum dot applies a linear ramp to the potential of the quantum dot. The linear ramp is applied during the timescale of one period of the electrostatic wave. In other words the potential of the quantum dot (considered in isolation of the potential due to the electrostatic wave) is changed from an initial amount $V_0$ to a final amount $V_f$ and the rate of change is linear with time. A linear ramp is easy to generate and apply and produces the desired potential change. However other changes in potential could be used. The change may be an increase or decrease of the confining potential depending on whether an electron is to be ejected or captured. To eject an electron the ramp decreases the confining potential whereas to capture an electron the confining potential is increased. The ramp is preferably applied during one period T of the electrostatic wave, i.e. one cycle of the wave (T=1/frequency), and is arranged such that a minimum in the electrostatic wave occurs during ramp application. For a linear ramp in a GaAs based system applying the ramp for a period of the order of 0.2T applied for approximately equal periods before and after the minimum in the electrostatic wave has been found to give good results. It will be appreciated however that other durations may give better results depending on the material system used and form of time varying voltage.

The means for adjusting the potential of the static quantum dot preferably comprises at least one electrode located at the quantum dot and means for supplying a voltage to the at least one electrode.

The quantum dot and quantum wire may be formed in any suitable material which offers suitable quantum confinement—as will be understood by one skilled in the art the quantum dot has confinement in three dimensions whereas a quantum wire has one degree of freedom. Conveniently the quantum wire and quantum dot are formed in a semiconductor material for instance a Gallium Arsenide based semiconductor system. A variety of techniques exist for forming quantum wires and quantum dots including hetero-epitaxial growth selective doping, etching and the use of electron gates. In one preferred embodiment a semiconductor quantum well is grown and doped so as to form a two dimensional electron gas. The quantum wire may then be formed by at least two side gate electrodes and means of applying a voltage to the electrodes. In use a voltage is applied to the side gate electrodes to change the potential landscape in the vicinity of the gate electrode so as to provide confinement. Similarly the static quantum dot may be formed by at least one gate electrode and means for applying a voltage to the at least one gate electrode. Again application of a voltage can change the potential landscape of the semiconductor to provide a quantum dot. The at least one quantum dot gate electrode and means for applying a voltage to the gate electrode may also provide the means for adjusting the potential of the quantum dot. The voltage supplied to the at least one quantum dot gate electrode can be varied to change the confining potential thereof.

The means for producing an electrostatic wave may be a surface acoustic wave transducer arranged to generate a surface acoustic wave propagating along the quantum wire. As will be well understood by the skilled person a surface acoustic wave propagating in a polar material such as a semiconductor can create an electrostatic wave. Surface acoustic wave transducers are well known and can be readily incorporated into semiconductor systems.

In order to allow two electrons held in the quantum dot to relax into the ground state, i.e. the singlet state, the temperature has to be low to minimise thermal excitation. For a Gallium Arsenide system the temperature may need to be of the order of milliKelvin. The apparatus therefore conveniently comprises a cryostat, for example a liquid helium cryostat, which contains the apparatus The energy/temperature scale can be increased by using different material systems and also by minimising feature size, such as through finer lithography etc. The quantum wire and quantum dot may also be formed in a molecular system. For instance a carbon nanotube could be used to form the quantum wire. This has the potential to raise the operating temperature to that of liquid nitrogen or higher.

As mentioned above the present invention provides a controlled and reliable method for interconverting static and flying electrons. Thus according to another aspect of the present invention there is provided a method of transferring an electron between a static and moving quantum dot comprising the steps of taking a quantum wire having a static quantum dot located part of the way along the quantum wire, generating an electrostatic wave propagating along the quantum wire to form moving quantum dots and applying a time varying potential to the static quantum dot in synchronicity with the electrostatic wave so as to transfer at least one electron between the static quantum dot and a moving quantum dot. For the avoidance of doubt the method may transfer an electron from a moving quantum dot to the static quantum dot or may transfer an electron from a moving quantum dot to the static quantum dot.

All of the advantages and embodiments of the first aspect of the invention apply equally to this aspect of the invention. Conveniently therefore the time varying potential applied to the static quantum dot is a linear ramp. The time varying potential is preferably applied during one period of the electrostatic wave and the application of the ramp coincides with the minimum of the electrostatic wave associated with the moving quantum dot.

Where the method involves transfer of an electron from the static quantum dot to the moving quantum dot the time varying potential reduces the confining potential of the static quantum dot whereas for transfer of an electron from the moving quantum well to the static quantum well the time varying potential increases the confining potential of the static quantum dot.

The method provides a convenient method of loading a static quantum dot with two electrons to form a spin entangled EPR pair. Thus a method of producing a fully entangled electron spin pair may comprise using the method described above to load two electrons into a static quantum dot and allowing the two electrons to relax to form a ground state singlet. In order to achieve and maintain the ground state singlet the quantum wire and quantum dot may be cooled so as to minimise thermal excitations.

Having formed an electron spin singlet in the static quantum dot, whether by loading electrons into the static dot via this method or some other method, the present invention may also be used to spatially separate the electrons whilst maintaining spin entanglement. A method of spatially separating an EPR electron spin pair formed in a static quantum dot may therefore comprise taking a quantum dot located along a quantum wire, the quantum dot containing two electrons in a singlet state and performing the method of the present invention to transfer one of the electron from the static quantum dot to a moving quantum dot. The method may also comprise the step of later applying another time dependent varying potential to the static quantum dot in synchronicity with the electrostatic wave so as to transfer the remaining electron from the static quantum dot to a different moving quantum dot.

DESCRIPTION OF THE DRAWINGS

The invention will now be described by way of example only with reference to the following drawings, of which.

DESCRIPTION OF THE INVENTION

Figure 1:
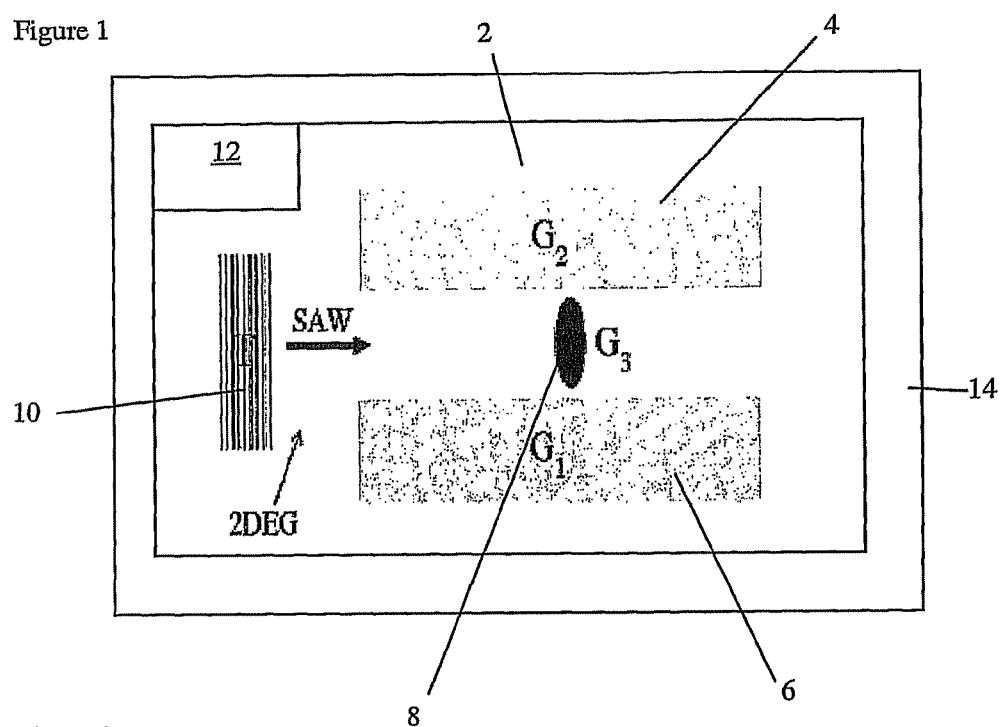
FIG. 1 shows a spin entangler according to an embodiment of the present invention.

The present invention comprises a quantum dot located part way along a quantum wire. One embodiment of such an apparatus is shown in FIG. 1. A Gallium Arsenide semiconductor quantum well or heterojunction 2 is doped so as to form a two dimensional electron gas. For instance a GaAs/AlGaAs heterojunction may be doped so as to form a two dimensional electron gas typically 100 nm below the surface with typical electron densities of the order of a few $10^{11}$ electrons per $cm^2$.

A quantum wire is formed by gate electrodes 4 and 6. Part way along the quantum wire a quantum dot is formed by gate electrode 8. Alternatively hard-confined wires may be formed by etching or even direct growth. For example, both semiconductor and carbon nanotube wires may be grown directly and manipulated using an atomic force microscope.

Also formed on semiconductor layers 2 is a surface acoustic wave (SAW) transducer 10 arranged to induce a SAW propagating along the axis of the quantum wire, i.e. in the direction of the arrow in FIG. 1. Due to the polar nature of the semiconductor substrate the SAW induces an electrostatic wave. As has been demonstrated previously the propagation of a SAW along a one dimensional channel in a two dimensional electron gas results in the formation of moving quantum dots. See Shilton et al., "High-frequency single-electron transport in a quasi-one-dimensional GaAs channel induced by surface acoustic waves", J. Phys. Condens. Matter 8, L531. The SAW induced dots can transport electrons whose number may be controlled down to one using surface gates yielding a quantised acoustoelectric current of nA.

In use a controller 12 controls the SAW transducer 10 to generate an SAW in the substrate and therefore induce an electrostatic wave along the quantum wire. The controller 12 also applies a time varying potential to gate 8 in synchronicity with the electrostatic wave to trap or eject electrons from the static quantum dot formed by gate 8.

Figure 2:
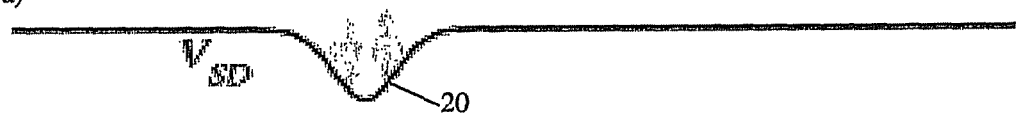
FIG. 2 illustrates the principles of converting a static qubit to a flying qubit according to the invention.
Figure 2:
Figure 2:
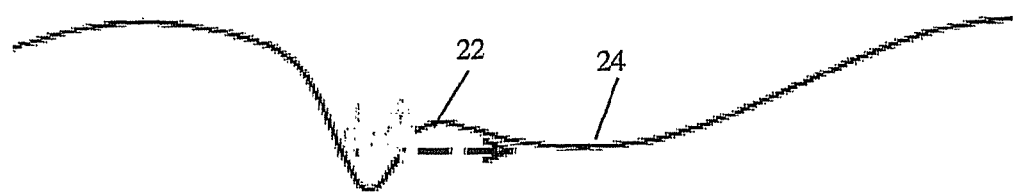
Figure 2:

FIG. 2 illustrates the principle of ejecting one of a pair of entangled electrons from the quantum dot. FIG. 2a schematically shows the potential landscape along the quantum wire in the absence of an electrostatic wave. The potential due to gate 8 results in a static quantum dot 20. This static quantum dot is illustrated holding two electrons which, as will be described in more detail below, relax into a singlet ground state, i.e. an entangled EPR pair with one electron spin-up and the other spin-down. FIG. 2b illustrates the potential along the quantum wire that would be created by applying a SAW in the absence of the static quantum dot.

To eject an electron a SAW is generated propagating along the quantum wire. FIG. 2c illustrates the combined potential along the quantum wire at a time just as one electron is ejected from the static quantum well. The potential of the static well is varied, in time with arrival of a minimum of the electrostatic wave created by the SAW so that there is a very high probability of one and only one electron tunnelling through a potential barrier 22 between the static quantum dot and the minimum 24 in the SAW potential. The degree of tunnelling can be efficiently controlled using a time dependent gate voltage which tunes the static quantum dot confining potential. FIG. 2d illustrates the combined potential at a later time when one electron has been captured in the moving quantum dot associated with the minimum 24 in the SAW potential and the other electron is still bound in the static quantum dot 20. Note that the state illustrated in FIG. 2d will be a fully entangled state in which the spins of the bound and propagating electrons are completely indeterminate until a measurement is made and the arrows are only meant to illustrate that the spins are antiparallel; which one is up and which is down is indeterminate until a measurement is made.

If required the trapped electron can also follow the first electron in a subsequent SAW moving quantum dot by again applying a local time dependent potential to the static quantum dot. The magnitude of this potential will be larger than that applied when there are two electrons. This is because there is a mutual repulsion between two electrons. The inverse process can also take place efficiently, i.e. one or both electrons can tunnel from a moving SAW quantum dot into the static quantum dot thus enabling interconversion of static and flying spin qubits.

To explain the invention in more detail the two-electron problem is studied within the effective mass approximation by considering the Hamiltonian $$H = \sum_{i=1,2}\left[-\frac{\hbar^2}{2m^*}\frac{\partial^2}{\partial x_i^2} + V(x_i, t)\right] + V_C(x_1, x_2) \qquad \text{Eqn (1)}$$

where the potential, V(x,t), is equal to the SAW potential, $V_{SAW}(x,t)$, and static quantum dot potential. $V_d(x,t)$, i.e.:

$$V(x,t) = V_{SAW}(x,t) + V_d(x,t) \qquad \text{Eqn (2)}$$

The SAW potential is;

$$V_{SAW}(x,t) = V_0\{\cos[2\pi(x/\lambda - ft)] + 1\} \qquad \text{Eqn (3)}$$

where $V_0$ represents the SAW potential amplitude which can be controlled by the applied power and we have chosen the typical values f=2.7 GHz for the SAW frequency and λ=1 μm for the SAW wavelength. The confining potential of the static quantum dot, SD, is modelled by;

$$V_d(x,t) = -V_w(t)\exp(-x^2/2l_w^2) \qquad \text{Eqn (4)}$$

where $V_w$, $l_w$ control the depth and width of the static quantum dot respectively.

The time-dependence of $V_w(t)$ is described later below. The Coulomb term $V_C(x_1, x_2)$ has the form;

$$V_C(x_1, x_2) = \frac{q^2}{4\pi\varepsilon_r\varepsilon_0 r} \qquad \text{Eqn (5)}$$

with $r=\sqrt{(x_1-x_2)^2 + \gamma_c^2}$ and $\gamma_c$=20 nm, which ensures that in y and z directions the electrons occupy at all times the ground state transverse modes.

To determine the two-electron state of the static quantum dot, SD, when the SAW potential is switched-off i.e. $V_{SAW}$=0 and with a time-independent, i.e. non-varying, SD potential, we diagonalise numerically the Hamiltonian (Eqn. 1) using the configuration interaction method.

The ground state $\Phi_3(x_1, x_2)$ is a singlet as has been also verified experimentally—see Friesen et al., "Practical design and simulation of silicon-based quantum-dot qubits", Phys. Rev. B, 67, 121301. This fully spin entangled state has effective orbital distribution $$\rho(x) = 2\int|\Phi_0(x,x')|^2 dx' \qquad \text{Eqn (6)}$$

which is shown in FIG. 3(a) for $V_w$=13 meV and $l_w$=25 nm. The dashed line in FIG. 3a shows the initial two-electron distribution. The two electrons are close to the weak correlation regime, i.e. for the ground state the Coulomb energy is weaker than the kinetic energy giving a distribution which peaks in the centre of the SD similarly to the non-interacting limit and, more importantly, the ground state singlet is well separated from excited states.

The time evolution of $\Phi_0(x_1, x_2)$ when $V_{SAW}$ is switched on, while keeping the SD potential fixed in time, is determined by solving numerically the time-dependent Schrödinger equation for the Hamiltonian (Eqn. 1). For $V_0$=5 meV and, for example, during one SAW period (T=1/f) the state remains well-localized in the SD without tunnelling and the electron distribution within the SD is hardly changed. In particular, the state evolves via non-adiabatic Landau-Zener transitions (LZTs) which enable the state to retain its initial character by changing in time the instantaneous eigenstate index (n→n±1) at each anticrossing point. To quantify this behaviour we have determined the instantaneous eigenspectrum $E_n$=$E_n(t)$, n=0, 1 . . . by solving the eigenvalue problem $$H(t)\Phi_n(t) = E_n(t)\Phi_n(t) \qquad \text{Eqn (7)}$$

(for singlet states) at each instant in time treating t as parameter. The LZT probability at an anticrossing point with energy gap 2δ is given by an approximate expression $$P_{LZ} \sim 1 - 2\pi\delta^2/\hbar\Lambda \qquad \text{Eqn (8)}$$

where the matrix element $$\Lambda = \langle\Phi_e|\partial H/\partial t|\Phi_l\rangle \qquad \text{Eqn (9)}$$

involves the states $\Phi_e$, $\Phi_l$ which enter and leave the anticrossing point and for the problem under study typical values are $P_{LZ}$>0.99. The LZT probability for a fixed $V_o$ lowers by decreasing $V_w$ since the tunnel barrier between SD and SAW-dot weakens and as a result strong tunnelling takes place. In the limit of a very small $V_w$ the electron state cannot follow the SAW propagation even for one cycle since due to the strong tunnelling it spreads in the continuum immediately when the SAW potential interacts with the SD.

The spin entangler mechanism is feasible within a Hamiltonian (Eqn 1) which conserves the symmetry of the state in time, as long as the resulting total time-dependent potential changes in such a manner so that to allow one electron to tunnel from the SD into the SAW-dot during a period of time for which the LZTs occur with negligible probability. On the other hand, after that period of time the potential must enable LZTs with high probability in order for the electron in the SD to remain well-localised as the SAW moves along. The present inventors have verified that such behaviour can be achieved by investigating the problem numerically for a typical range of parameters. A simple technique to tune the total potential in this way is to decrease the confining potential of the SD by applying a linear time-dependent gate voltage of the form;

$$V_w(t) = \begin{cases} V_w^0, & t \leq t_a \\ V_w^0 - \Delta_w \frac{(t-t_a)}{t_b-t_a}, & t_a \leq t \leq t_b \\ V_w^0 - \Delta_w, & t \geq t_b. \end{cases} \quad \text{Eqn (10)}$$

where $\Delta_w = V_w^0 - V_w^f$.

FIG. 3b shows the relevant final time occupation probabilities as a function of the final SD potential $V_w^f$ with a fixed initial potential, $V_w^0$ of 13 meV. $P_{SD,SD}$ represented by the dashed line represents the probability of finding the two electrons in the SD. $P_{SAW,SAW}$ is the probability of finding both electrons in the SAW-dot and is shown by the dotted line. $P_{SD,SAW}$ is shown by the solid line and represents the probability of finding one electron in the SD and the other in the SAW-dot. The total duration of the dynamics is from $t_0=0$ (when the electrostatic wave is at a maximum) to $t_f=T$, with $t_a=0.45T$ and $t_b=0.65T$. A key observation for the efficiency of the entangler is that the SD potential must change while it scans the SAW-potential minimum, otherwise the fraction of the initial state which tunnels off the SD cannot be trapped and carried along by the SAW-dot. This requires that $T_b=t_b-t_a$ is of the order of T/2, which is within the range of the available electronics. It should be noted that one knows the evolution of the SAW wave at the SD and so can synchronise the time dependent potential accurately.

Figure 3:
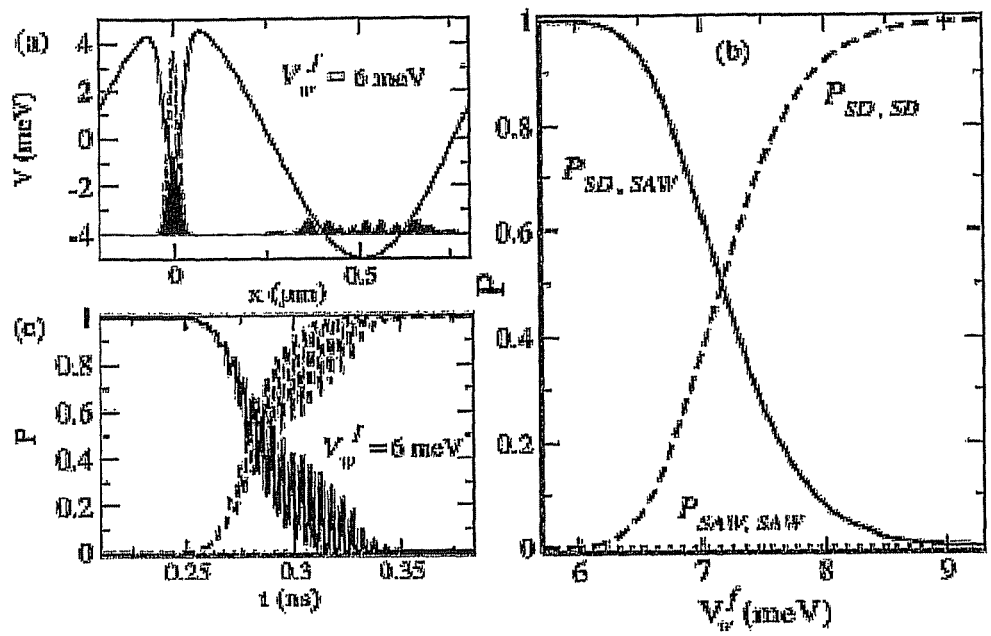
FIG. 3 shows a) the total potential and initial and final two-electron distribution with two electrons initially held in the static quantum dot, b) the final time occupation probabilities for the electrons as a function of final quantum dot depth and c) the occupation probabilities as a function of time.

Even though for all values of the final SD potential, $V_w^f$, illustrated in FIG. 3 the SD can bind two electrons in the absence of the SAW, the physical effect of the gate when combined with the SAW potential is to decrease in time the binding energy of the SD forcing one electron to tunnel partly and even totally in the SAW-dot. This is why $P_{SD,SD}$ decreases with decreasing $V_w^f$ whilst $P_{SD,SAW}$ increases. The range within which $V_w^f$ is varied ensures that a single electron can successfully accomplish LZTs, following the SAW propagation without tunnelling, ensuring that is why the probability $P_{SAW,SAW}\sim0$. On the other hand, when double occupation in the SD is appreciable tunnelling off the SD can still occur after $t_f$. This can be minimized by restoring the SD to its original depth with the gate, though this regime with large $P_{SD,SD}$ is not relevant for an entangler. One can achieve a nearly ideal operation mode for the entangler when $V_w^f$ is less than or approximately 6 meV which, as shown in FIG. 3b, at the final time results in one trapped electron in the SD and a second electron trapped in the moving SAW-dot with very high probability $P_{SD,SAW}>0.99$. For this case FIG. 3a shows the initial (dashed) and final (solid) electron distribution when the Coulomb interaction is practically off. The SD-state is the corresponding lowest eigenstate, whereas the SAW-state consists of a superposition of the lowest SAW-potential minimum eigenstates whose number can be controlled with choice of $T_p$, SD and SAW parameters. At the final time the SD-state develops via non-adiabatic LZTs, whereas the SAW-state develops adiabatically with no leakage due to the high confinement provided by $V_0$.

The electron which remains trapped in the SD can be made to follow the SAW-electron by further decreasing the depth of the SD and releasing the trapped electron in a SAW-dot that follows. In this way flying entangled nonlocal electron pairs travelling at the sound velocity $\lambda f=2700$ ms$^{-1}$ can be obtained. Since the wavepackets are trapped in the SAW-dots any physical spreading to neighbouring SAW-dots is negligible. If necessary the two electrons can be driven to different channels using a Y-branch design (see, for example, Talyanskii et al. "Acoustoelectric Y-branch Switch", Appl. Phys. Lett. 88, 083501).

Figure 4:
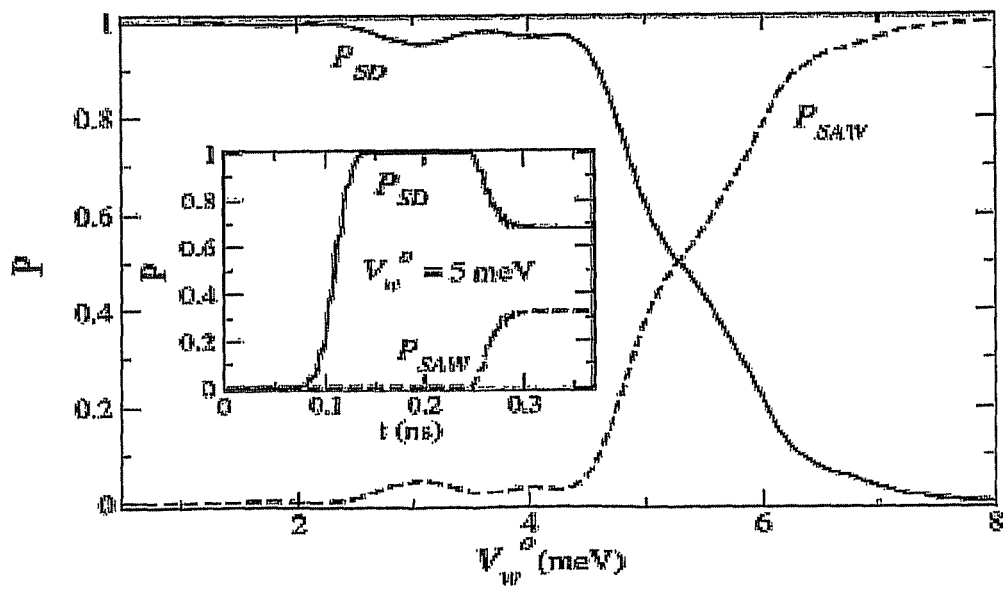
FIG. 4 shows the occupation probabilities as a function of time when one electron is initially carried in a moving quantum dot.
Figure 5:
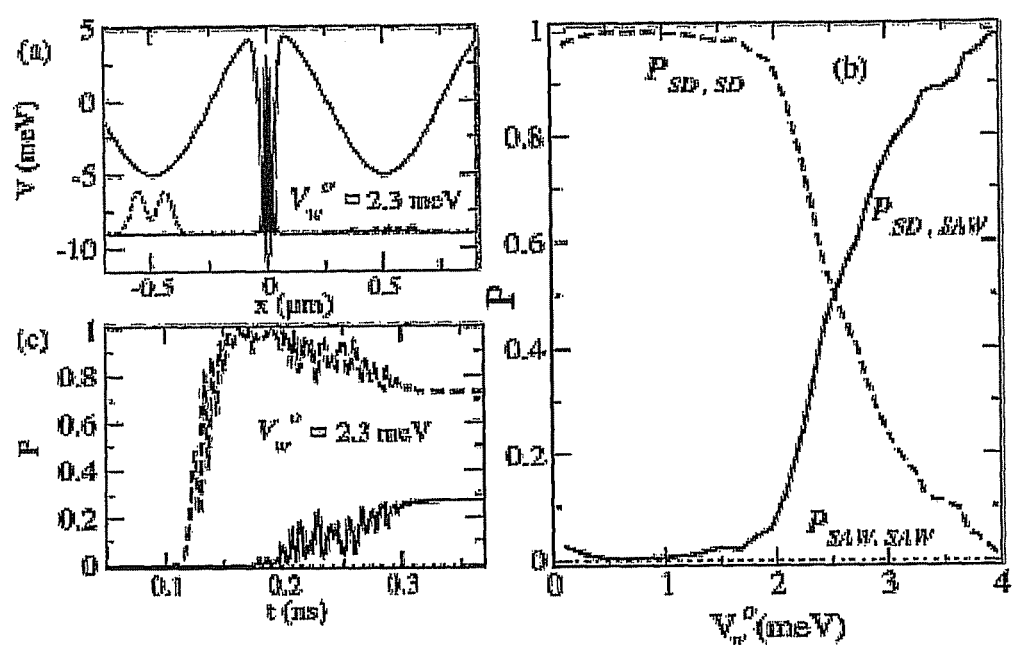
FIG. 5 shows a) the total potential and initial and final two-electron distribution with two electrons initially held in the moving quantum dot, b) the final time occupation probabilities for the electrons as a function of initial quantum dot depth and c) the occupation probabilities as a function of time.

In addition to the spin entangler concept a SAW can also be used to manipulate a small number of electrons and specifically to load a SD with one or two electrons. For this purpose a SAW-dot carrying at $t_0$ one or two electrons can be driven towards the empty SD whose confining potential is tuned with a time-dependent gate voltage. In FIG. 4 is shown the relevant occupation probabilities at $t_f$ (similar behaviour is displayed for $t>t_f$) as a function of $V_w^0$ for a single electron which, at $t_0$ is in the ground state of the SAW. The gate potential of the SD is varied according to equation 10 where $V_w^f=11$ meV and with $t_a=0.39T$ and $t_b=0.58T$. The mechanism is efficient since it can induce a high loading probability i.e. $P_{SD}>0.99$ for $V_w^0$ less than or approximately 2 meV. By increasing $V_w^0$ higher eigenstates of the SD mediate the tunnelling process resulting in smaller $P_{SD}$ since the width of the tunnel barrier between SD and SAW-dot increases and inhibits electron tunnelling into the lowest SD state. In addition, for the higher excited SD states the process is not efficient because the electron tunnels in and subsequently off the SD without following LZTs. The robustness of this loading mechanism has also been verified for cases in which the initial SAW-state is a random superposition of the low lying SAW-eigenstates. FIG. 5 shows the results of extending the analysis to two electrons carried at $t_0$ in a single SAW-dot in the corresponding ground state. It can be seen that, similarly to the one electron case, an increase of $V_w^0$ lowers the occupation probability $P_{SD,SD}$, while $P_{SAW,SAW}\sim0$ indicating that, for this range of $V_w^0$, there is always enough time for one electron to tunnel in the SD and follow LZTs. The Coulomb interaction strengthens the tunnelling process for one electron, though the second electron has to overcome the Coulomb repulsion of the first and, as excited states mediate the process, it tunnels in and off the SD, hence remaining in the SAW-dot in a superposition of the lowest eigenstates. Typical parameters are $V_w^f=14.5$ meV with $t_a=0.42T$ and $t_b=0.7T$. Unlike the narrow SD, the SAW-potential minimum is relatively wide hence the two electrons are strongly correlated, occupying relatively distinct regions in the SAW-dot (see FIG. 5a) yielding a small antiferromagnetic exchange energy. This very small energy splitting of singlet and triplet leads to high uncertainty in the degree of entanglement of the incident electrons in the SAW-dot which in turn leads to a high uncertainty in the resulting static-flying qubit pair. This would not therefore be an effective procedure for producing fully entangled EPR pairs, unlike the method of the present invention which ensures relaxation to the singlet ground state within the SD due to the much higher energy splitting of singlet and triplet. By tuning the depth of the SD synchronously with the moving SAW-dot containing two electrons, these electrons may be both bound in the SD with high probability. This therefore offers an alternative two electron loading strategy of a SD.

The present invention therefore provides an electron spin entangler which generates non-local singlet states and can be realised with existing semiconductor SAWs-based technology. EPR electron spin pairs can be efficiently produced and reliably converted between static and flying qubits. The invention also provides a SAW scheme of loading a SD with one and two electrons enabling arbitrary interconversion of flying and static spin qubits.

Detailed calculations have been given above for a GaAs quantum well system but other material systems could be used as mentioned below. For any set of material system parameters the appropriate Schrödinger equation can be formulated and the LZT and occupation probabilities determined using the model outlined above to determine the appropriate fixed SD potential and time varying gate potential required.

For the GaAs system described above the temperature of the quantum wire and quantum dot has to be held very low, in the region of mK, in order to minimise thermal excitation and associated decoherence. Such temperature could be achieved by cooling with liquid helium and referring back to FIG. 1 the substrate is enclosed in a cryostat 14. However other material systems could be used and the temperature scale may be increased by appropriate choice of materials and control of feature sizes, for example through finer lithography. Higher confinement may be achieved by using molecular systems and, in particular, systems based on carbon nanotubes and fullerenes or on graphene are particularly attractive. These systems give higher confinement energies and have extremely long spin-coherence times due to their isotropic purity and small spin-orbit interaction.

The invention claimed is:

1. An apparatus comprising, in use, a static quantum dot located part way along a quantum wire, an electrostatic wave generator for generating an electrostatic wave propagating along the quantum wire and a controller for adjusting the electrostatic potential of the quantum dot in synchronisation with the propagating electrostatic wave.

2. An apparatus as claimed in claim 1 wherein, in use, the controller for adjusting the electrostatic potential of the quantum dot tunes the potential of the quantum dot in synchronisation with the propagating electrostatic wave so as to allow an electron to tunnel between said quantum dot and a moving quantum dot fowled by the electrostatic wave.

3. An apparatus as claimed in claim 2 where the controller for adjusting the potential of the quantum dot is arranged to apply a linear ramp to the potential of the quantum dot.

4. An apparatus as claimed in claim 3 wherein the linear ramp is applied during the timescale of one period of the electrostatic wave.

5. An apparatus as claimed in claim 3 wherein the linear ramp is applied such that a minimum in the electrostatic wave occurs during application of the ramp.

6. An apparatus as claimed in claim 5 wherein the ramp is applied for a period of approximately 0.2T where T is the period of the electrostatic wave.

7. An apparatus as claimed in claim 2 wherein the controller for adjusting the potential of the quantum dot is capable of increasing the confining potential of the quantum dot so as to capture an electron carried by the electrostatic wave in the quantum dot or decrease the confining of the potential dot so as to transfer an electron from the quantum dot to the electrostatic wave.

8. An apparatus as claimed in claim 7 wherein the electron transfer is achieved without losing spin coherence.

9. An apparatus as claimed in claim 1 further comprising at least one electrode located at the quantum dot wherein the controller is adapted to supply a voltage to the at least one electrode.

10. An apparatus as claimed in claim 1 wherein the quantum wire and quantum dot are formed in a layered semiconductor structure, and wherein the layered semiconductor structure is doped so as to form, in use, a two dimensional electron gas.

11. An apparatus as claimed in claim 10 wherein the quantum wire is formed by at least two side gate electrodes, the quantum dot is formed by at least one gate electrode, and the controller is adapted to supply voltages to these gate electrodes.

12. An apparatus as claimed in claim 1 wherein the electrostatic wave generator is a surface acoustic wave transducer arranged to generate a surface acoustic wave propagating along the quantum wire.

13. A method of transferring an electron between a static and moving quantum dot comprising the steps of taking a quantum wire having a static quantum dot located part of the way along the quantum wire, generating an electrostatic wave propagating along the quantum wire to form moving quantum dots and applying a time varying potential to the static quantum dot in synchronicity with the electrostatic wave so as to transfer at least one electron between the static quantum dot and a moving quantum dot.

14. A method as claimed in claim 13 wherein the transfer of the at least one electron maintains spin coherence.

15. A method as claimed in claim 13 wherein the time varying potential applied to the static quantum dot is a linear ramp.

16. A method as claimed in claim 13 wherein the time varying potential is applied during one period of the electrostatic wave.

17. A method as claimed in claim 13 wherein the application of the time varying potential coincides with the minimum of the electrostatic wave associated with the moving quantum dot.

18. A method of producing a fully entangled electron spin pair comprising using the method of claim 13 to load two electrons into a static quantum dot and allowing the two electrons to relax to form a ground state singlet.

19. A method of spatially separating an EPR electron spin pair formed in a static quantum dot comprising taking a quantum dot located along a quantum wire, the quantum dot containing two electrons in a singlet state and performing the method of claim 13 to transfer one of the electron from the static quantum dot to a moving quantum dot.

20. A method as claimed in claim 19 further comprising the step of later applying another time dependent varying potential to the static quantum dot in synchronicity with the electrostatic wave so as to transfer the remaining electron from the static quantum dot to a different moving quantum dot.

* * * * *